United States Patent
Kudo et al.

(10) Patent No.: US 6,853,037 B2
(45) Date of Patent: Feb. 8, 2005

(54) FABRICATION OF LOW POWER CMOS DEVICE WITH HIGH RELIABILITY

(75) Inventors: Tomohiko Kudo, Tokyo (JP); Naohiko Kimizuka, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 248 days.

(21) Appl. No.: 09/872,007

(22) Filed: Jun. 4, 2001

(65) Prior Publication Data

US 2001/0048136 A1 Dec. 6, 2001

(30) Foreign Application Priority Data

Jun. 5, 2000 (JP) ........................................ 2000/168072

(51) Int. Cl.[7] ........................ H01L 29/76; H01L 29/94; H01L 31/062; H01L 31/113; H01L 21/8238

(52) U.S. Cl. ..................... 257/369; 257/338; 257/350; 257/351; 257/357; 257/371; 438/152; 438/153; 438/199; 438/223; 438/224; 438/227; 438/228

(58) Field of Search ................................ 257/338, 350, 257/351, 357, 369, 371; 438/152–153, 199, 223, 224, 227–228

(56) References Cited

U.S. PATENT DOCUMENTS

| | | | | |
|---|---|---|---|---|
| 4,651,406 A | * | 3/1987 | Shimizu et al. | 438/275 |
| 4,881,112 A | * | 11/1989 | Matsushita | 257/338 |
| 4,912,054 A | * | 3/1990 | Tomassetti | 438/208 |
| 5,049,519 A | * | 9/1991 | Teng | 438/219 |
| 5,428,239 A | * | 6/1995 | Okumura et al. | 257/371 |
| 5,495,122 A | * | 2/1996 | Tada | 257/392 |
| 5,600,164 A | * | 2/1997 | Ajika et al. | 257/321 |
| 5,795,627 A | * | 8/1998 | Mehta et al. | 427/526 |
| 5,866,445 A | * | 2/1999 | Baumann | 438/199 |
| 5,882,993 A | * | 3/1999 | Gardner et al. | 438/591 |
| 5,930,613 A | * | 7/1999 | Schlais et al. | 438/201 |
| 5,989,948 A | * | 11/1999 | Vines et al. | 438/216 |
| 6,037,222 A | * | 3/2000 | Huang et al. | 438/257 |
| 6,040,019 A | * | 3/2000 | Ishida et al. | 427/526 |
| 6,060,753 A | * | 5/2000 | Campardo et al. | 257/369 |
| 6,107,134 A | * | 8/2000 | Lu et al. | 438/239 |
| 6,137,144 A | * | 10/2000 | Tsao et al. | 257/357 |
| 6,143,594 A | * | 11/2000 | Tsao et al. | 438/199 |
| 6,146,948 A | * | 11/2000 | Wu et al. | 438/275 |
| 6,184,093 B1 | * | 2/2001 | Sung | 438/275 |
| 6,207,510 B1 | * | 3/2001 | Abeln et al. | 438/276 |
| 6,258,673 B1 | * | 7/2001 | Houlihan et al. | 438/275 |
| 6,297,103 B1 | * | 10/2001 | Ahn et al. | 438/275 |
| 6,303,521 B1 | * | 10/2001 | Jeng | 438/770 |
| 6,335,262 B1 | * | 1/2002 | Crowder et al. | 438/440 |
| 6,339,001 B1 | * | 1/2002 | Bronner et al. | 438/275 |
| 2001/0040256 A1 | * | 11/2001 | Trivedi et al. | 257/368 |

FOREIGN PATENT DOCUMENTS

| | | |
|---|---|---|
| JP | 10-335656 | 12/1998 |
| JP | 11-162973 | 6/1999 |

* cited by examiner

*Primary Examiner*—Amir Zarabian
*Assistant Examiner*—Ida M. Soward
(74) *Attorney, Agent, or Firm*—McGinn & Gibb, PLLC

(57) ABSTRACT

A semiconductor device includes a relatively lower threshold level MOSFET and relatively higher threshold level MOSFETs of n- and p-types. The higher threshold level MOSFETs have gate oxide films which is thicker than that of the lower threshold level MOSFET and, in addition, the gate oxide film of the higher threshold level MOSFET of n-type is thicker than that of the higher threshold level MOSFET of p-type. To fabricate the semiconductor device, implantation treatments of fluorine ions are carried out before the gate oxide treatment. Specifically, as for the higher threshold level MOSFETs of n- and p-types, implantation treatments of fluorine ions are independently carried out with unique implantation conditions.

19 Claims, 2 Drawing Sheets

FABRICATION OF LOW POWER CMOS DEVICE WITH HIGH RELIABILITY

BACKGROUND OF THE INVENTION

This invention relates to semiconductor device comprising MOSFETs with higher and lower threshold levels and, more particularly, to growth of gate oxide films of multiple thickness on a semiconductor substrate, in accordance with the threshold levels and types of the MOSFETs.

The recent trend in CMOS-LSI circuit fabrication is to achieve high speed operation and low consumption power on the semiconductor device formed on one chip. To this end, MOSFETs on one chip are designed to operate with different threshold levels. Specifically, MOSFETs for low consumption power are designed to operate with a higher threshold level, while MOSFETs for high speed-driving are designed to operate with a lower threshold level.

It is known to the inventors that thicknesses of the gate oxide films of higher threshold MOSFETs are determined to be thicker than that of lower threshold MOSFETs, because of letting standby current of the higher threshold MOSFETs not depend on the gate-channel leakage current characteristics but on subthreshold characteristics of the higher threshold MOSFETs. If thicknesses of the gate oxide films of higher threshold MOSFETs are substantially equal to that of lower threshold MOSFETs, the gate-channel leakage current becomes larger than the subthreshold current (i.e., off-current) in the higher threshold MOSFETs, resulting in making the consumption power high.

Technologies for growth of oxide films of multiple thickness are disclosed, for example, in Japanese Unexamined Patent Publications (JP-A) Nos. H10-335656 and H11-162973. It is known to the inventors that the foregoing technologies are applicable for the fabrication of the semiconductor device having MOSFETs with different threshold levels. Specifically, the implantation treatment of fluorine ions into a predetermined region on a semiconductor substrate is carried out before a single thermal oxidation process, so that the single thermal oxidation process makes different thicknesses of the gate oxide films, because fluorine ions promote the thermal oxidation process. That is, the gate oxide film on the predetermined ion-implanted region is thicker than that of yet-ion-implanted region.

SUMMARY OF THE INVENTION

It is an object of the present invention to apply the foregoing technologies to CMOS-LSI circuit fabrication, in consideration of the properties of n- and p-MOSFETs, and thereby, to improve the CMOS-LSI circuit with respect to high speed operation and low consumption power.

N- and p-types of MOSFETs operating with the same threshold level have gate-channel leakage current characteristics different from each other, as known to the inventors. In detail, the gate-channel leakage current of the n-MOSFET is one digit greater than that of the p-MOSFET. On the other hand, subthreshold currents, namely off-currents, of the n- and p-MOSFETs are generally determined to be substantially equal to each other, in the prior art.

It is noted here that the thickness of the gate oxide film of the p-MOSFET does not need to be equal to that of the n-MOSFET but is allowed to be thinner than that of the n-MOSFET, because the gate-channel leakage current of the p-MOSFET is one digit smaller than that of the n-MOSFET. The thinner gate oxide film makes the operating speed of the p-MOSFET high.

According to one aspect of the present invention, a semiconductor device comprising first to third MOSFETs. The first MOSFET is designed to have a threshold level which is relatively lower, and has a first gate oxide film. The second MOSFET of an n-type is designed to have a threshold level which is relatively higher, and has a second gate oxide film. The third MOSFET of a p-type is designed to have a threshold level which is relatively higher. The third MOSFET has a third gate oxide film which is thicker than the first gate oxide film and is thinner than the second gate oxide film. The second and third MOSFETs may cooperate with each other and form a complementary MOS circuitry.

According to another aspect of the present invention, a method is for fabricating on a semiconductor substrate a semiconductor device as above-mentioned, and comprises the following steps. An isolation region is formed within the semiconductor substrate and close to a surface of the semiconductor substrate, and defines a first region and a second region on the semiconductor substrate, the first region being for the first MOSFET and the second region being for the second and third MOSFETs. Fluorine ions are selectively implanted into a first part of the second region with a first ion-implantation condition, the first part of the second region being for the second MOSFET, the first ion-implantation condition being determined to form the second gate oxide film. Fluorine ions selectively implanted into a second part of the second region with a second ion-implantation condition, the second part of the second region being for the third MOSFET, the second ion-implantation condition being determined to form the third gate oxide film. For example, the first and second ion-implantation conditions are determined so that the third gate oxide film is thinner the second gate oxide film.

After the fluorine ion-implantation processes, gate oxide films are simultaneously grown on and over the first and second regions of the semiconductor substrate. Then the first to third MOSFETs are formed by using the simultaneously grown oxide films, so that the first to third MOSFETs have the first to third gate oxide films, respectively.

With such structure and process, the semiconductor device can achieve high speed operation with high reliability and low consumption power, because the suitable thicknesses of the gate oxide films are provided, for example, to the lower threshold MOSFET, the higher threshold p-MOSFET, and the higher threshold n-MOSFET.

These and other features and advantages of the present invention will be better understood by considering the following detailed description of the invention which is presented with the attached drawings.

Figure 1:
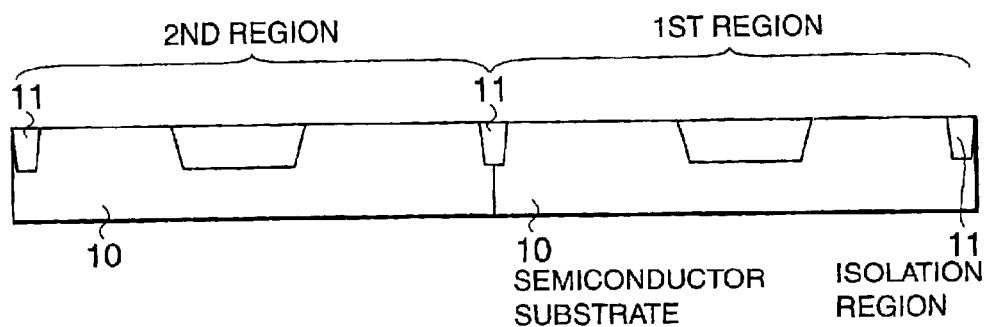
FIG. 1 is a sectional view showing one step in fabrication of a semiconductor device according to one embodiment of the present invention.

The figures referred to herein are drawn for clarity of illustration and are not necessarily drawn to scale. Moreover, the figures referred to herein focus on a few oxide regions within CMOS-LSI circuits. Elements having the same reference numeral in FIGS. 1 to 7 refer to elements having similar structure and function.

DESCRIPTION OF THE PREFERRED EMBODIMENTS

A semiconductor device according to a preferred embodiment of the present invention comprises two CMOS circuits, one of which has higher threshold MOSFETs of n- and p-types, while the other has lower threshold MOSFETs of n- and p-types. The lower threshold MOSFETs have a first gate oxide film common thereto. The higher threshold n-MOSFET has a second gate oxide film thicker than the first gate oxide film. The higher threshold p-MOSFET has a third gate oxide film which is thicker than the first gate oxide film and is thinner than the second gate oxide film.

The semiconductor device can be fabricated according to the following fabrication process of the preferred embodiment of the present invention.

Referring to FIG. 1, isolation regions 11 are formed within a semiconductor substrate 10 and close to the surface of the semiconductor substrate 10, so that a first region and a second region are defined on the semiconductor substrate 10. The first region is for the lower threshold MOSFETs, while the second region is for the higher threshold MOSFETs.

The illustrated isolation regions are fabricated in LOCOS (Local Oxidation on Substrate) process, and are field oxide films. Isolation regions may be fabricated in STI (Shallow Trench Isolation) process.

Figure 2:
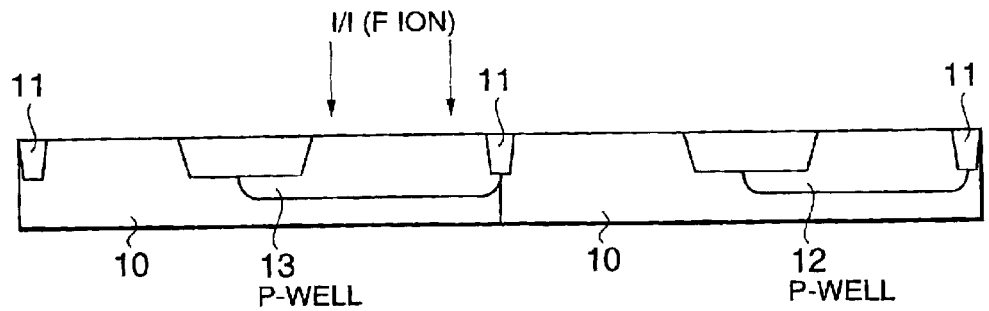
FIG. 2 is a sectional view showing another one step following the step of FIG. 1 in the fabrication according to one embodiment of the present invention.

Referring to FIG. 2, P-well 12 is formed within the first region, by selectively implanting boron ions into a corresponding part of the first region. The first selective ion-implantation of boron is carried out by using photo-lithography technique with a first mask layer (not shown). In detail, the first mask layer is formed over the semiconductor substrate 10 before the first boron ion-implantation, and defines a region that is not exposed for the first boron ion-implantation. The first mask layer may be composed of a photo-resist material as known to one of ordinary skill in the art of semiconductor device fabrication. In addition, the first mask layer is removed from the semiconductor substrate 10 after the first boron ion-implantation.

After the removal of the first mask layer, P-well 13 is formed within the second region, by selectively implanting boron ions into a corresponding part of the second region. The second selective ion-implantation of boron is carried out by using photo-lithography technique with a second mask layer (not shown). In detail, the second mask layer is formed over the semiconductor substrate 10 after the removal of the first mask layer and before second first boron ion-implantation, and defines a region that is not exposed for the second boron ion-implantation. The second mask layer may be composed of a photo-resist material as known to one of ordinary skill in the art of semiconductor device fabrication. Herein, dosage in the second boron ion-implantation is different from that in the first boron ion-implantation, because of different threshold levels to be desired.

In this embodiment, the second mask layer is further used for a first fluorine ion-implantation. That is, fluorine ions are selectively implanted into the P-well 13 with a first ion-implantation condition by the use of the second mask layer. In the illustrated implantation, the first ion-implantation condition is that dosage of the fluorine ions is $1.2 \times 10^{15}/cm^2$, and that implantation energy is 5 keV. The dosage in the first ion-implantation condition may be of $7.0 \times 10^{14} - 1.2 \times 10^{15}/cm^2$ inclusive. After the first fluorine ion-implantation, the second mask layer is removed from the semiconductor substrate 10.

Figure 3:
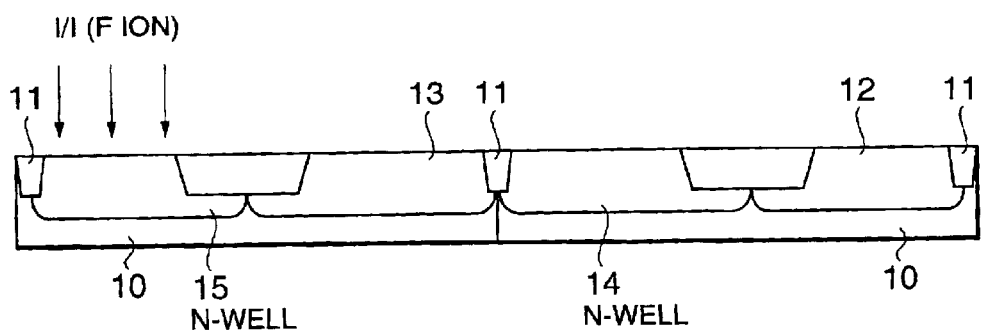
FIG. 3 is a sectional view showing another one step following the step of FIG. 2 in the fabrication according to one embodiment of the present invention.

Referring to FIG. 3, N-well 14 is formed within the first region, by selectively implanting phosphorus ions into a corresponding part of the first region. The first selective ion-implantation of phosphorus is carried out by using photo-lithography technique with a third mask layer (not shown). In detail, the third mask layer is formed over the semiconductor substrate 10 after the removal of the second mask layer and before the first phosphorus ion-implantation. The third mask layer defines a region that is not exposed for the second phosphorus ion-implantation. The third mask layer may be composed of a photo-resist material as known to one of ordinary skill in the art of semiconductor device fabrication. In addition, the third mask layer is removed from the semiconductor substrate 10 after the first phosphorus ion-implantation.

After the removal of the third mask layer, N-well 15 is formed within the second region, by selectively implanting phosphorus ions into a corresponding part of the second region. The second selective ion-implantation of phosphorus is carried out by using photo-lithography technique with a fourth mask layer (not shown). In detail, the fourth mask layer is formed over the semiconductor substrate 10 after the removal of the third mask layer and before the second phosphorus ion-implantation. The third mask layer defines a region that is not exposed for the second phosphorus ion-implantation. The third mask layer may be composed of a photo-resist material as known to one of ordinary skill in the art of semiconductor device fabrication. Herein, dosage in the second phosphorus ion-implantation is different from that in the first phosphorus ion-implantation, because of different threshold levels to be desired.

The fourth mask layer is further used for a second fluorine ion-implantation, in this embodiment. That is, fluorine ions are selectively implanted into the N-well 15 with a second ion-implantation condition, by the use of the fourth mask layer. In the illustrated implantation, the second ion-implantation condition is that dosage of the fluorine ions is $6.0 \times 10^{14}/cm^2$, and that implantation energy is 5 keV. The dosage of the fluorine ions in this step may be below $6.0 \times 10^{14}/cm^2$. After the second fluorine ion-implantation, the fourth mask layer is removed from the semiconductor substrate 10.

It is noted here that the first and second ion-implantation conditions are determined so that the higher threshold MOSFETs have gate-channel leakage current characteristics substantially equal to each other and that standby currents of the higher threshold MOSFETs do not depend on the gate-channel leakage current characteristics but on subthreshold characteristics of the MOSFETs. In addition, the first and second ion-implantation conditions are determined so that the third gate oxide film is thinner the second gate oxide film. Specifically, in this embodiment, the first ion-implantation condition comprises first dosage of fluorine ions and predetermined implantation energy, while the second ion-implantation condition comprises second dosage of fluorine ions and the predetermined implantation energy, the second dosage being less than the first dosage.

Figure 4:
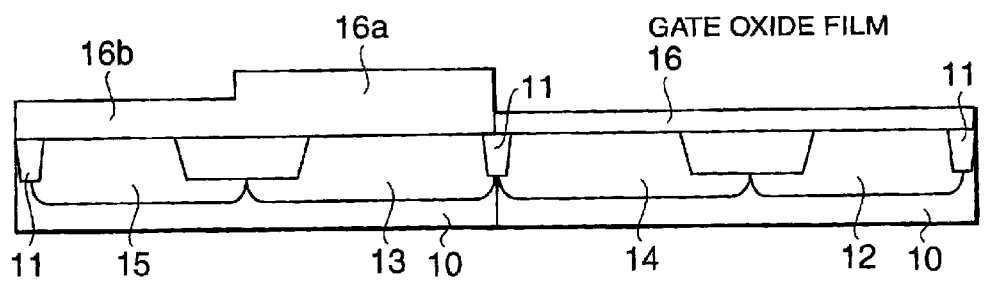
FIG. 4 is a sectional view showing another one step following the step of FIG. 3 in the fabrication according to one embodiment of the present invention.

Referring to FIG. 4, oxide films 16, 16a, 16b are simultaneously grown on and over the first and second regions of the semiconductor substrate 10, after the removal of the fourth mask layer. As illustrated, the simultaneously growing oxide films is carried out in single thermal oxidation process. In this embodiment, the thickness of the gate oxide film 16 (first gate oxide film) with not fluorine ion-implantation becomes 2.0 nm. On the other hand, the thicknesses of the gate oxide films 16a, 16b (second and third gate oxide film) becomes 2.7 nm and 2.4 nm, respectively, because of the fluorine ion-implantation treatments with the first and second ion-implantation conditions.

Figure 5:
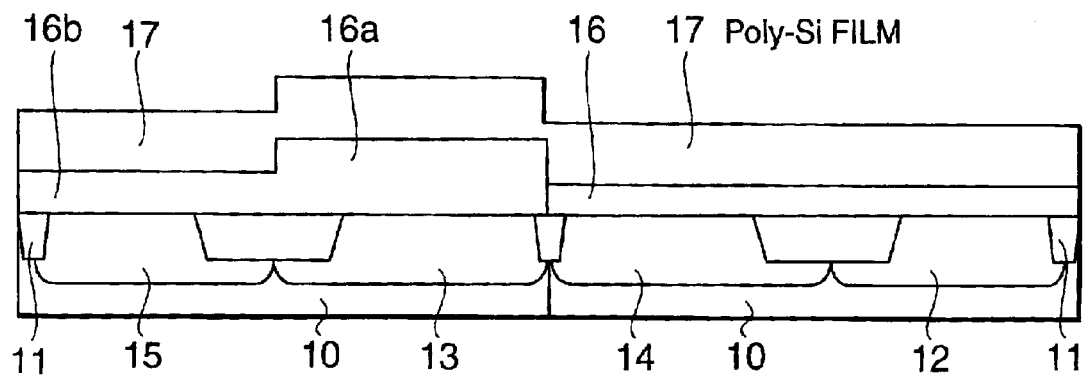
FIG. 5 is a sectional view showing another one step following the step of FIG. 4 in the fabrication according to one embodiment of the present invention.

Referring to FIG. 5, poly-silicon materials are deposited on the gate oxide films 16, 16a, 16b, to form a poly-Si film 17. Other materials may be selected to be gate electrode, as known to one of ordinary skill in the art of semiconductor device.

Figure 6:
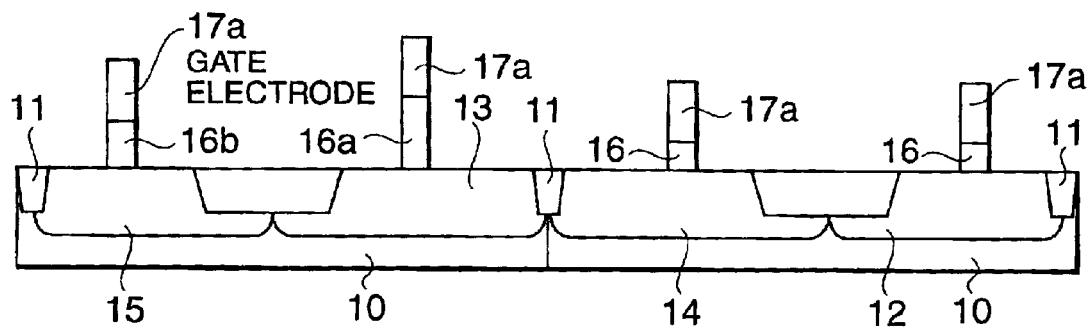
FIG. 6 is a sectional view showing another one step following the step of FIG. 5 in the fabrication according to one embodiment of the present invention.
Figure 7:
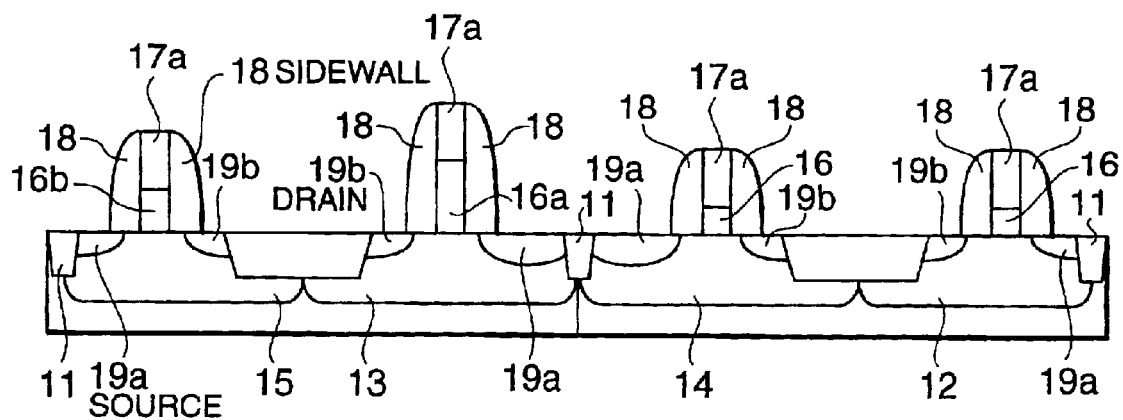
FIG. 7 is a sectional view showing another one step following the step of FIG. 6 in the fabrication according to one embodiment of the present invention.

Then, referring to FIG. 6, the poly-Si film 17 is etched together with the respective parts of the gate oxide films 16, 16a, 16b, by the use of photo-lithography technique, so as to be gate electrodes 17a of 150 nm.

After that, a silicon-dioxide film is deposited over the semiconductor substrate 10, and is etched with a suitable mask to form sidewalls 18 on the sides of the gate electrodes 17a and the gate oxide films 16, 16a, 16b. Then an ion-implantation treatment into the P- and N-well 12–15 is carried out with the sidewalls 18 being as masks, so as to form source and drain regions 19a, 19b, and thereby, to obtain MOSFETs of LDD (Lightly Doped Drain) structure.

Fabrication of a semiconductor device according to another preferred embodiment of the present invention is a modification of the above-described embodiment except for the first and second ion-implantation conditions.

In this embodiment, the first ion-implantation condition comprises predetermined dosage of fluorine ions and first implantation energy, while the second ion-implantation condition comprises the predetermined dosage of fluorine ions and second implantation energy, the second implantation energy being higher than the first implantation energy. Specifically, in this embodiment, the predetermined dosage is $6.0 \times 10^{14}/cm^2$, and the first and second implantation energies are 3 keV and 5 keV, respectively.

With the fabrication method of this embodiment, the semiconductor device of the similar structure to the above-described embodiment. That is, the lower threshold MOSFETs have a first gate oxide film common thereto, the higher threshold n-MOSFET has a second gate oxide film thicker than the first gate oxide film, and the higher threshold p-MOSFET has a third gate oxide film which is thicker than the first gate oxide film and is thinner than the second gate oxide film.

While this invention has thus far been described in conjunction with the preferred embodiment thereof, it will now be readily possible for skilled persons in the art to put this preferred embodiment into various other manners. For example, the above-mentioned MOSFETs all have LDD structure, but may be other structure. The above-mentioned semiconductor device comprises two types of lower threshold MOSFETs, but may comprise only lower threshold n-MOSFETs or only lower threshold p-MOSFETs. The above-mentioned lower threshold MOSFETs have the same thickness of gate oxide, but the lower threshold n-MOSFET may have a gate oxide film thicker than that of the lower threshold p-MOSFET and thinner than that of the higher threshold p-MOSFET. In this case, fluorine ions of suitable dosage is further implanted into the N-well 14 before the thermal oxidation process.

What is claimed is:

1. A semiconductor device comprising:
   two a first MOSFETs each comprising a first gate oxide film;
   a second MOSFET comprising a second gate oxide film thicker than the first gate oxide film; and
   a third MOSFET of a p-type comprising a third gate oxide film which is thicker than the first gate oxide film and is thinner than the second gate oxide film,
   wherein said second MOSFET and said third MOSFET form a first single CMOS pair, and
   wherein said two first MOSFETs form a second single CMOS pair.

2. A method for fabricating on a semiconductor substrate a semiconductor device, the method comprising:
   forming an isolation region within a semiconductor substrate and close to a surface of the semiconductor substrate to define a first region for a first gate oxide film of a two first MOSFETs and a second region for second and third MOSFETs;
   selectively implanting fluorine ions into a first part of the second region with a first ion-implantation condition, the first part of the second region being for the second MOSFET, the first ion-implantation condition being determined to form a second gate oxide film;
   selectively implanting fluorine ions into a second part of the second region with a second ion-implantation condition, the second part of the second region being for the third MOSFET, the second ion-implantation condition being determined to form a third gate oxide film;
   simultaneously growing oxide films on and over the first and second regions of the semiconductor substrate; and
   forming the first to third MOSFETs by using the simultaneously grown oxide films, so that the first to third MOSFETs have the first to third gate oxide films, respectively, wherein the second gate oxide film is thicker than the first gate oxide film and the third gate oxide film is thicker than the first gate oxide film and is thinner than the second gate oxide film; and
   wherein the threshold level of the two first MOSFETs is relatively low and the threshold levels of the second and third MOSFETs are relatively high, and the second MOSFET is an n-type and the third MOSFET is a p-type, wherein said second MOSFET and said third MOSFET form a first single CMOS pair and said two first MOSFETs form a second single CMOS pair.

3. A fabrication method as claimed in claim 2, wherein the first and second ion-implantation conditions are determined so that the third gate oxide film is thinner than the second gate oxide film.

4. A fabricating method as claimed in claim 3, wherein the first ion-implantation condition comprises first dosage of fluorine ions and predetermined implantation energy, while the second ion-implantation condition comprises second dosage of fluorine ions and the predetermined implantation energy, the second dosage being less than the first dosage.

5. A fabricating method as claimed in claim 4, wherein the first dosage is of $7.0 \times 10^{14} - 1.2 \times 10^{15}/cm^2$ inclusive, and the predetermined implantation energy is 5 keV.

6. A fabricating method as claimed in claim 5, wherein the second dosage is equal to or below $6.0 \times 10^{14}/cm^2$.

7. A fabricating method as claimed in claim 3, wherein the first ion-implantation condition comprises predetermined dosage of fluorine ions and first implantation energy, while the second ion-implantation condition comprises the predetermined dosage of fluorine ions and second implantation energy, the second implantation energy being higher than the first implantation energy.

8. A fabricating method as claimed in claim 7, wherein the predetermined dosage is $6.0 \times 10^{14}/cm^2$, and the first and second implantation energies are 3 keV and 5 keV, respectively.

9. A fabricating method as claimed in claim 3, wherein the first and second ion-implantation conditions are further determined so that the second and third MOSFETs have gate-channel leakage current characteristics substantially equal to each other.

10. A fabricating method as claimed in claim 9, wherein the first and second ion-implantation conditions are further determined so that standby current in the second and third MOSFETs do not depend on the gate-channel leakage current characteristics but on subthreshold characteristics of the second and third MOSFETs.

11. A fabricating method as claimed in claim 2, further comprising:
   before the selectively implanting fluorine ions into the first part of the second region, forming P-well as the first part within the second region; and
   before the selectively implanting fluorine ions into the second part of the second region, forming N-well as the second part within the second region.

12. A fabricating method as claimed in claim 11, wherein the forming P-well is carried out by selectively implanting boron ions into a part of the second region that becomes the first part.

13. A fabricating method as claimed in claim 11, wherein the forming N-well is carried out by selectively implanting phosphorus ions into a part of the second region that becomes the second part.

14. A fabrication method as claimed in claim 2, wherein the forming the isolation region is carried out in LOCOS (Local Oxidation on Substrate) process.

15. A fabricating method as claimed in claim 2, wherein the forming the isolation region is carried out in STI (Shallow Trench Isolation) process.

16. A fabricating method as claimed in claim 2, wherein the simultaneously growing oxide films is carried out in single thermal oxidation process.

17. The method of claim 2, wherein the second and third MOSFETs have equal gate-channel leakage current characteristics.

18. The method of claim 17, wherein the standby current in each of the second and third MOSFETs depends on subthreshold characteristics, said subthreshold characteristics comprising other than gate channel leaking current characteristics.

19. A semiconductor device comprising:
   two a first MOSFETs each comprising a first gate oxide film;
   a second MOSFET of an n-type comprising a threshold level which is relatively higher than said two first MOSFETs, the second MOSFET comprising a second gate oxide film thicker than the first gate oxide film; and
   a third MOSFET of a p-type comprising a threshold level which is relatively higher than said two first MOSFET, the third MOSFET comprising a third gate oxide film which is thicker than the first gate oxide film and is thinner than the second gate oxide film,
   wherein said second MOSFET and said third MOSFET form a first single CMOS pairs, and
   wherein said two first MOSFETs form a second single CMOS pair.

* * * * *